(12) United States Patent
Rhodes

(10) Patent No.: US 7,440,568 B2
(45) Date of Patent: Oct. 21, 2008

(54) BIPOLAR PULSE FORMING LINE

(75) Inventor: Mark A. Rhodes, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 365 days.

(21) Appl. No.: 11/450,429

(22) Filed: Jun. 9, 2006

(65) Prior Publication Data

US 2007/0013315 A1  Jan. 18, 2007

Related U.S. Application Data

(60) Provisional application No. 60/689,635, filed on Jun. 9, 2005.

(51) Int. Cl.
*H04M 1/00* (2006.01)
(52) U.S. Cl. .................. 379/413.04; 379/414; 379/398; 315/505; 307/106; 333/17.3; 333/101; 331/172
(58) Field of Classification Search .............. 315/39, 315/39.3, 505; 333/17.3, 20, 101; 307/106, 307/115; 331/99, 172, 173; 379/398, 401, 379/413.04, 414
See application file for complete search history.

(56) References Cited

U.S. PATENT DOCUMENTS

| 4,888,556 A | 12/1989 | Battram et al. |
| 5,124,658 A | 6/1992 | Adler |
| 5,412,254 A | 5/1995 | Robinson et al. |
| 5,757,146 A | 5/1998 | Carder |
| 6,214,297 B1 | 4/2001 | Zhang et al. |
| 7,268,641 B2 * | 9/2007 | Zucker et al. .................. 333/20 |
| 2007/0165839 A1 * | 7/2007 | London .................. 379/413.04 |

OTHER PUBLICATIONS

Masahiro Ozawa et al, "Bidirectional Line Pulser system for Linear Induction Accelerator" Dept. Of Energy Sciences, Tokyo Institute of Tech. Nagatsuta. Midori-ku, Yokahama 226-8502 Japan, Jun. 1999.
Ian Smith, "Linear Induction Accelerators Made from Pulse-line Cavities with External Pulse Injection" Rev. Sci. Instrum. 50(6) Jun. 1979 American Institute of Physcis.
Ian Smith, "Induction Voltage Adders and the Induction Accelerator Family" Physical Review Special Topics—Accelerators and Beams vol. 7 06-4801 (2004).

* cited by examiner

*Primary Examiner*—Haissa Philogene
(74) *Attorney, Agent, or Firm*—James S. Tak; John H. Lee

(57) ABSTRACT

A bipolar pulse forming transmission line module for linear induction accelerators having first, second, third, fourth, and fifth planar conductors which form an interleaved stack with dielectric layers between the conductors. Each conductor has a first end, and a second end adjacent an acceleration axis. The first and second planar conductors are connected to each other at the second ends, the fourth and fifth planar conductors are connected to each other at the second ends, and the first and fifth planar conductors are connected to each other at the first ends via a shorting plate adjacent the first ends. The third planar conductor is electrically connectable to a high voltage source, and an internal switch functions to short a high voltage from the first end of the third planar conductor to the first end of the fourth planar conductor to produce a bipolar pulse at the acceleration axis with a zero net time integral. Improved access to the switch is enabled by an aperture through the shorting plate and the proximity of the aperture to the switch.

11 Claims, 9 Drawing Sheets

BIPOLAR PULSE FORMING LINE

I. CLAIM OF PRIORITY IN PROVISIONAL APPLICATION

This application claims priority in provisional application Ser. No. 60/689,635, filed on Jun. 9, 2005, entitled "Bipolar Pulse Forming line" by Mark A. Rhodes.

The United States Government has rights in this invention pursuant to Contract No. W-7405-ENG48 between the United States Department of Energy and the University of California for the operation of Lawrence Livermore National Laboratory.

II. FIELD OF THE INVENTION

The present invention relates to bipolar pulse generators and more particularly to a bipolar pulse forming line/generator having a wraparound shorted-line configuration which enables improved access to an internal switch region.

III. BACKGROUND OF THE INVENTION

Electron-beam induction accelerators, such as linear induction accelerators (LIA), are typically constructed in a modular multi-stage manner with each stage developing an increment of the total accelerator voltage. This enables the use of many small accelerating voltages instead of one very large one to confine the total acceleration voltage and suppress breakdown, losses, and electromagnetic interference. One particular type of pulse-power architecture for driving modules in LIAs is the Blumlein pulse generator comprised of parallel-plate transmission lines and arranged in stacked configuration. Whether driven by stacked Blumleins or other pulse-power architectures, however, the multi-stage induction accelerator structure is often enclosed in a grounded metal enclosure so that the full beam voltage (which for many applications is in the Megavolt range) is not developed on the exterior of the machine. This is typically accomplished using magnetic materials such as ferrite or tape-wound magnetic alloys to increase the inductance of the short-circuit created by the metal case surrounding each accelerator stage, and prevent the external metal case from shorting the accelerating field. Such magnetic core materials, however, are heavy, bulky, expensive, nonlinear, and electrically lossy for the fast, nanosecond-range pulses of interest in many applications, and are therefore generally undesirable.

Various core-free pulse architectures are known. One class uses pairs of lines with widely different dielectric constants while another class uses combinations of open-circuit lines combined with short-circuit lines. In either case these designs are encased in metal and support stackable output pulses without the need for magnetic isolation cores. These configurations are known as bipolar or zero-integral configurations because they produce a positive and negative voltage pulse with a net time integral of zero, i.e. having equal and opposite voltage-time products. The zero voltage-time integral that results means that zero net magnetic flux has been induced in the cavity. Acceleration of the beam takes place on the second part of the pulse and can use all of the available energy. Such bipolar pulse generation structures are typically presented in the literature as generic transmission line diagrams that could be realized in either coaxial or planar geometry.

One example of such a bipolar pulse forming line is shown in the publication, "Linear Induction Accelerators Made from Pulse-Line Cavities with External Pulse Injection," by Ian Smith (Rev. Sci. Instr., vol. 50(6), pp. 714-718, 1979), incorporated by reference herein. FIGS. 2a-d of that publication show several exemplary bipolar transmission line configurations. In particular, the transmission line structure shown in FIG. 2d is reprinted and shown in FIG. 1 of the present drawings at reference character 100. It is shown having an upper conductor 101, a middle conductor 102, and a lower conductor 103. The middle conductor 102 is actively chargeable to a voltage $V_0$, while the outer conductors 101 and 103 are ground conductors. Dielectric material/media 108, 109 fill the cavities between the conductors 101-103, with both characterized by impedance $Z_0$. A first end 105 of the formed stack is the pulse output end, e.g. adjacent an acceleration axis for LIA applications, and a second end 106 of the stack is opposite the first end. At the second end 107, the first conductor 101 and the third conductor 103 are electrically connected via a passive, short-circuit line ("shorted-line") 104 extending away from the second end 106 in an opposite direction of the first end 105, and having dielectric media 110 which together form a passive shorted section also characterized by impedance $Z_0$. And a switch region 107 is shown at the second end 106 to discharge the energy stored in the second conductor 102 to the third conductor 103.

When switched, this structure 100 produces a bipolar pulse of $\pm V_0$ when charged to $V_0$ into a matched load (not shown) of $2Z_0$ that appears at the second half cycle. Naturally, the structure is fully encased in metal. The shorted-line represented by conductor 104 and dielectric 110 on the left side is passive in that it is not charged. In this manner, the cavities of this structure are shaped internally as constant impedance transmission lines to generate rectangular flat-topped acceleration pulses with a constant current beam load. Moreover, the transmission line circuits produce voltage waveforms that are bidirectional and have zero time integral of voltage when driving a matching load.

The configuration of this type of structure can be problematic, however, because the pulse-forming switches are inside the structure cavity and not easily accessible for triggering. It would be advantageous to provide a bipolar, zero-net-time-integral pulse generator design for use in an LIA that is stackable, does not require a magnetic core, and would allow reasonable engineering access to the switches that are always required in real systems.

IV. SUMMARY OF THE INVENTION

One aspect of the present invention includes a bipolar pulse forming transmission line module comprising: first, second, third, fourth, and fifth conductors forming an interleaved stack with each conductor having a first end, and a second end adjacent an acceleration axis, said first and second planar conductors connected to each other at the second ends, said fourth and fifth conductors connected to each other at the second ends, said first and fifth conductors connected to each other at the first ends, said first, second, fourth, and fifth conductors electrically connectable to a ground potential, and said third conductor electrically connectable to a high voltage source; first, second, third, and fourth dielectric layers provided between the first/second, second/third, third/fourth, and fourth/fifth conductors, respectively, to form an upper passive shorted line, a lower passive shorted line, and two active charged lines between the upper and lower passive shorted lines; and a switch capable of shorting a high voltage from the first end of the third conductor to the first end of the fourth conductor to produce a bipolar pulse with a zero net time integral.

Another aspect of the present invention includes a linear induction accelerator, comprising: a bipolar pulse forming transmission line module comprising: first, second, third, fourth, and fifth conductors forming an interleaved stack with each conductor having a first end and a second end adjacent an acceleration axis, said first and second conductors connected to each other at the second ends, said fourth and fifth conductors connected to each other at the second ends, said first and fifth conductors connected to each other at the first ends, said first, second, fourth, and fifth conductors electrically connectable to a ground potential, and said third conductor electrically connectable to a high voltage source; first, second, third, and fourth dielectric layers provided between the first/second, second/third, third/fourth, and fourth/fifth conductors, respectively, to form an upper passive shorted line, a lower passive shorted line, and two active charged lines between the upper and lower passive shorted lines; and a switch capable of shorting a high voltage from the first end of the third conductor to the first end of the fourth conductor to produce a bipolar pulse with a zero net time integral; and high voltage power supply means connected to charge said third conductor to a high potential.

V. BRIEF DESCRIPTION OF THE DRAWINGS

The accompanying drawings, which are incorporated into and form a part of the disclosure, are as follows.

VI. DETAILED DESCRIPTION

The present invention pertains to a magnetic-core-free induction LINAC geometry that is based on a parallel-plate transmission line, stacked Blumlein-like structure which produces a symmetric bipolar, zero integral output voltage pulse into a matched load that appears during the second half of the voltage cycle. As such, while the structure is surrounded by a groundable metal boundary it does not require a magnetic core to keep the metal boundary from shorting the output and is, in theory, 100% efficient into a matched load. Furthermore, the structure has a "wraparound" configuration of the shorted-line section which shortens the overall span (e.g. radial span) of the structure, and enables facilitated access to an internal switch region within the structure cavity. The present invention may be utilized in compact linear induction accelerator (LIA) structures for a variety of applications.

Figure 2:
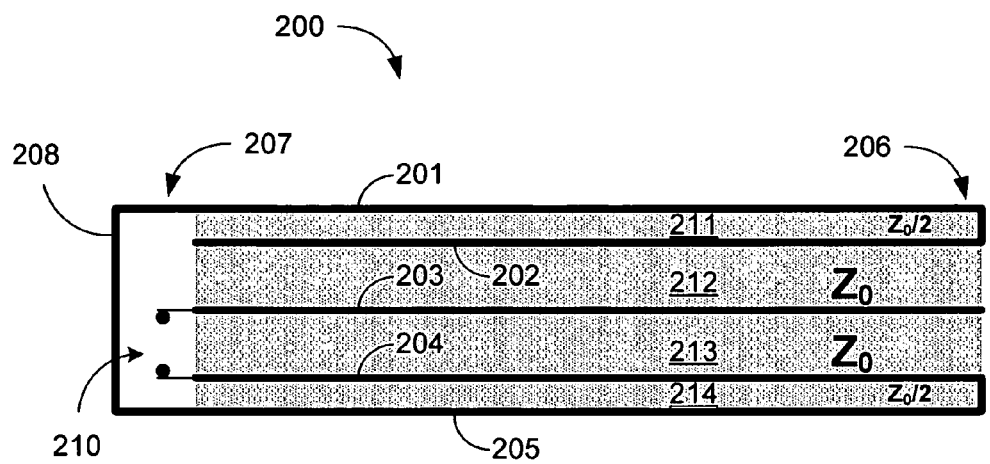
FIG. 2 is a sectional view of a first exemplary embodiment of the bipolar pulse forming line module of the present invention, which is electrically equivalent to the prior art structure in FIG. 1.

Turning now to the drawings, FIG. 2 show a first exemplary structure of the bipolar pulse forming line of the present invention, generally indicated at reference character 200. In particular, the structure 200 is a single module which preferably represents a single stage in an LIA, for example. It includes first, second, third, fourth and fifth conductors (201-205 respectively) arranged sequentially in an interleaved manner, and each preferably having a planar configuration as parallel-plate transmission lines. The structure has two ends: a first end 206 which is the output pulse end and is adjacent an acceleration axis (not shown) when utilized in an LIA, and a second end 207 opposite the first end. The first and second conductors 201, 202 are shown connected to each other at the first end, and the fourth and fifth conductors 204, 205 are likewise shown connected to each other at the first end. At the second end, the first and fifth conductors 201, 205 are connected to each other, preferably via a shorting plate 208. The first, second, fourth, and fifth conductors are at ground potential, while the third conductor 203 is connectable to a high voltage source to store high energy in the capacitance of the third conductor to the grounded cavity.

First, second, third, and fourth dielectric layers (211-214, respectively) are provided between the first/second, second/third, third/fourth, and fourth/fifth conductors, respectively, to form an upper passive shorted line, a lower passive shorted line, and two active charged lines between the upper and lower passive shorted lines. An ideal dielectric material with an $\epsilon r$ of 10 is preferably used. As shown in FIG. 2, the two centrally-located active charged lines are each preferably characterized by impedance $Z_0$, and the upper and lower passive shorted lines are each preferably characterized by impedance $Z_0/2$. These impedance values are chosen to produce symmetric bipolar pulses having a preceding pulse which are equal in magnitude and duration to the accelerating pulse, and which produce a zero net integral of voltage when driving a matching load, i.e. $2Z_0$ (shown as 303 in FIG. 3).

Figure 1:
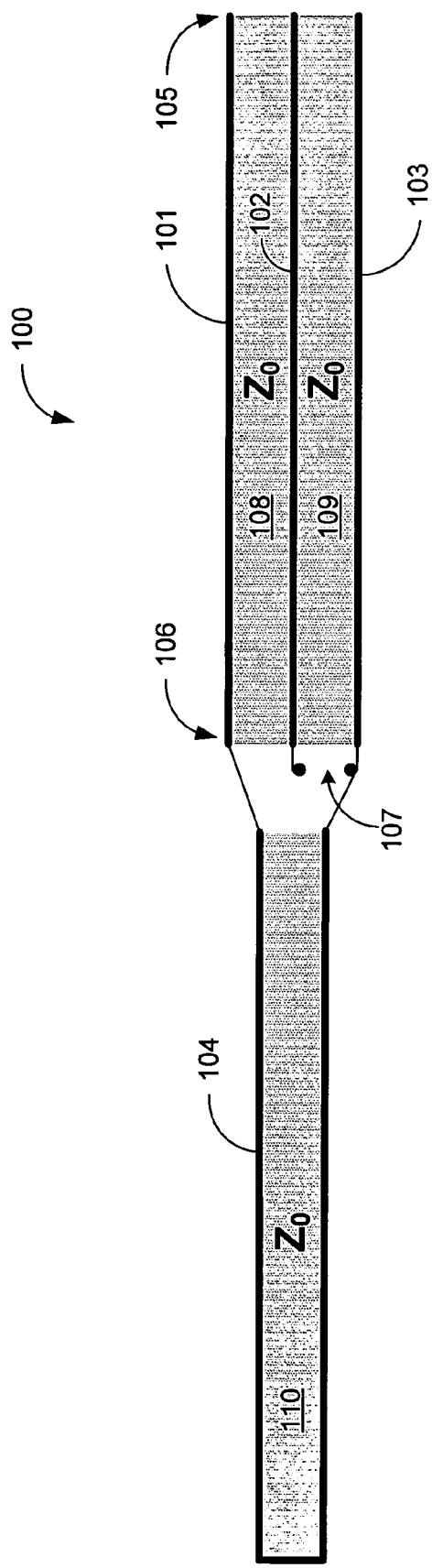
FIG. 1 is a sectional view of an accelerator cavity module known in the art which is itself the pulse forming line.

A switch 210 is provided at the second ends of the third and fourth conductors 203, 204 to discharge energy from the third conductor to the fourth conductor. As shown in FIG. 2, the switch is therefore located inside the structure cavity. Triggering of the switch may be accomplished by internally mounted triggers/activators, or by providing external access to the switch through the shorting plate (discussed below). Examples of internal switch triggering/activation includes, but not limited to, electrical or optical triggers, such as for example flashboard or other high voltage trigger known in the art. In any case, the placement of the passive shorted-line sections above and below the charged-line sections, as described above, effectively "wraps" the shorted-line sections around the charged-line sections to modify the module configuration to that which is half as long but 50% taller than the equivalent prior art system discussed in FIG. 1.

Figure 3:
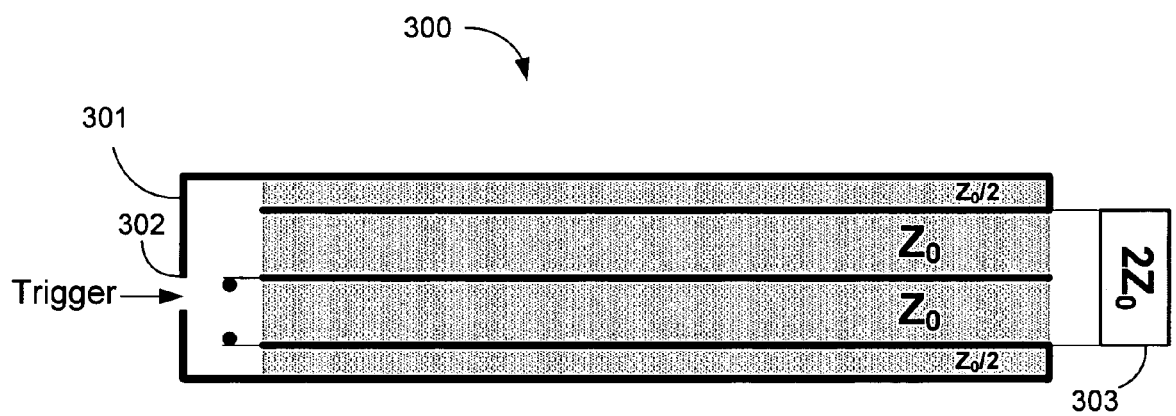
FIG. 3 is a sectional view of a second exemplary embodiment of the bipolar pulse forming line module of the present invention similar to FIG. 2, but also having an aperture to enable facilitated access to the switch region, and shown with a matched load.
Figure 4:
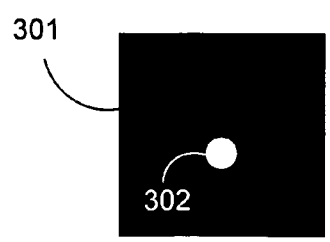
FIG. 4 is an end view of the second end 307 showing the access aperture to the switch region.

FIGS. 3 and 4 show a second exemplary structure of the bipolar pulse forming line of the present invention, generally indicated at reference character 300. As can be seen between FIGS. 2 and 3, the structure 300 is similar to structure 200 in every respect except the shorting plate 301 in FIG. 3 is provided with an aperture/throughbore 302 to enable external triggering of the internal switch. FIG. 3 also shows a matched load of $2Z_0$. In particular, because the passive, shorted-line sections are positioned above and below the charged-line sections, the aperture 302 and the shorting plate 301 may be positioned close to and adjacent the switch region to improve access to the switch-region. As shown in FIG. 3, the switch is located just inside the shorting plate 301 on the left side of the structure. This structure produces a bipolar pulse of $\pm V_0$ when charged to $V_0$ into a matched load of $2Z_0$ (shown at reference character 303) that appears at the second half cycle.

Figure 5:
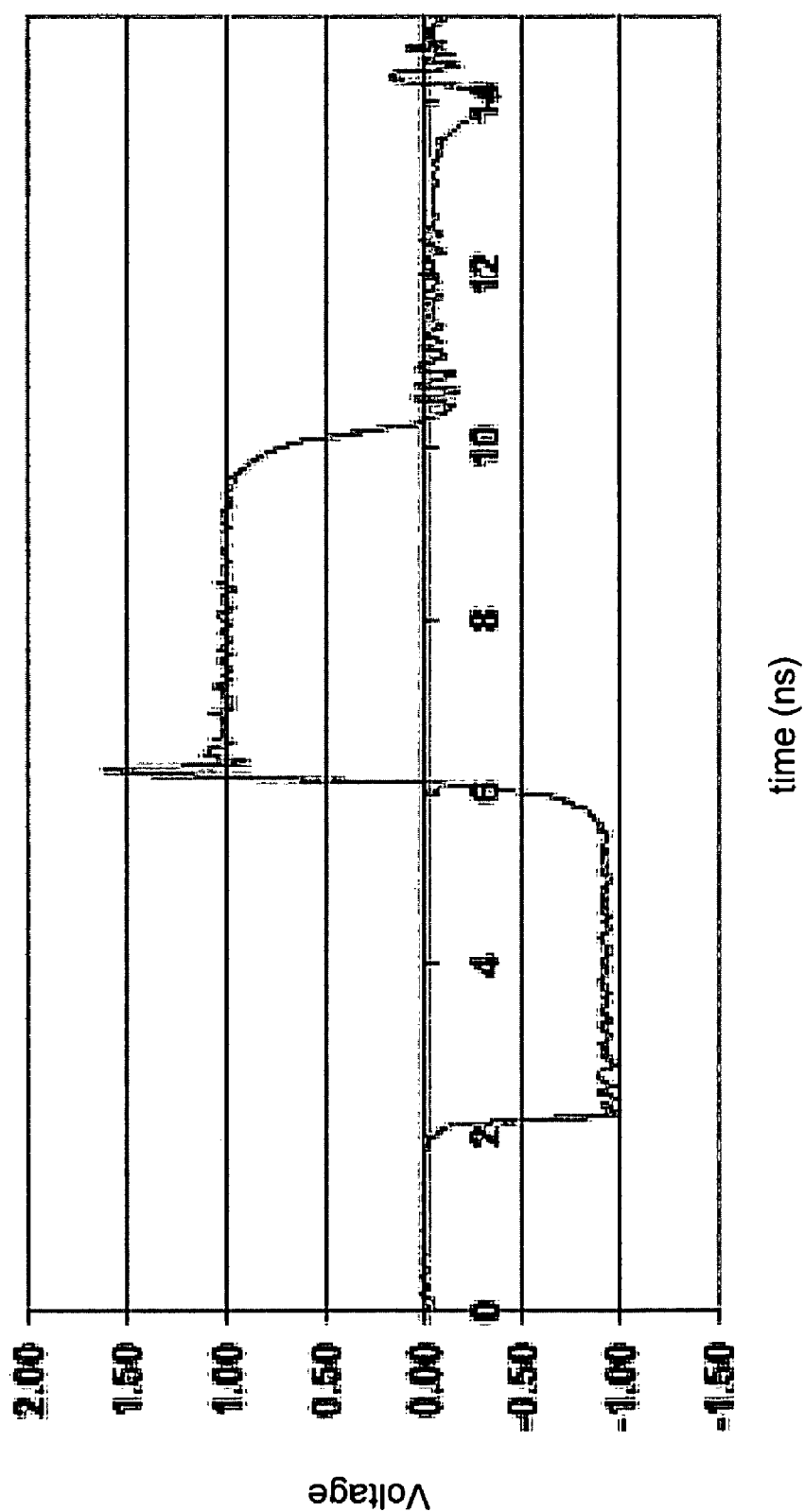
FIG. 5 is a graph illustrating the output pulse from a model of a single stage, such as the single module in FIG. 2, using a commercial code known as XFDTD™.

The electromagnetic operation of this structure and geometry has been verified using the commercial code XFDTD™, which computer models structures directly in the time-domain. It allows initial charging of metal plates and allows the use of circuit components such as resistors (for loads) and switches. A single-stage model of the structure was constructed as shown in FIG. 2. The charged conductor (i.e. third conductor) was set at 1 volt, the switches closed at t=0, and switches closed in series with load resistors at 6 ns. The resulting bipolar voltage pulse is shown in FIG. 5. It is notable that although there is a DC short around the outside of the structure, the output pulse is not loaded by the inductance of this path.

Figure 6:
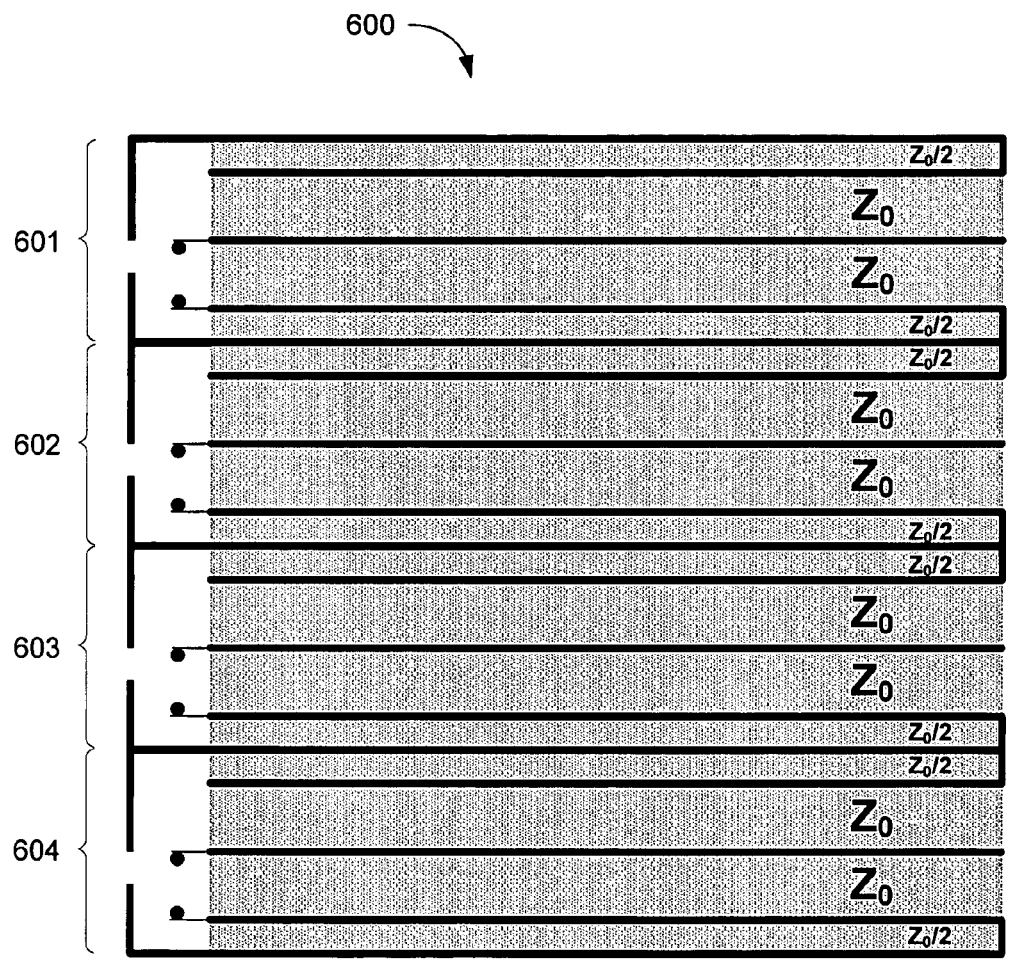
FIG. 6 is a sectional view of third exemplary embodiment of the present invention showing a multi-stage stacked arrangement of the bipolar pulse forming line modules, and in particular showing a stacked arrangement of four modules of the type shown in FIG. 3.

FIG. 6 shows a third exemplary embodiment of a stacked multi-stage accelerator structure using the bipolar pulse forming line modules discussed above. In particular, FIG. 6 shows a four-stage accelerator structure comprises four modules 601-604. Each module has the wraparound configuration of the passive shorted lines discussed above, with impedance values of $Z_0$ for each of the two centrally-located active charged lines, and impedance values of $Z_0/2$ for each of the upper and lower passive shorted lines. In this manner, individual stages may be stacked to achieve higher voltage levels. It is appreciated that other multi-stage configurations may be used as necessary other than four stages.

Figure 7:
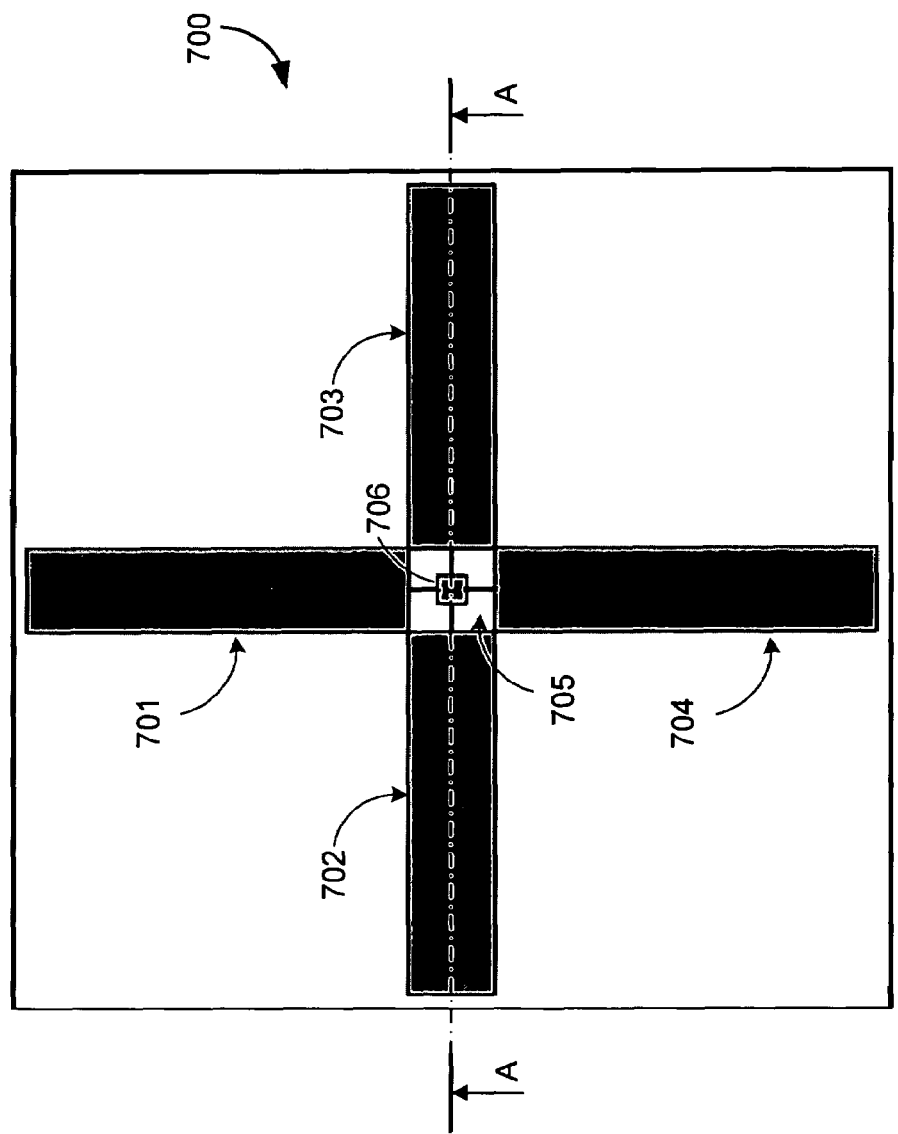
FIG. 7 is a top view of a fourth exemplary embodiment of a four-stage four-quadrant accelerator structure of the present invention, and in particular looking down the bore of the structure.
Figure 8:
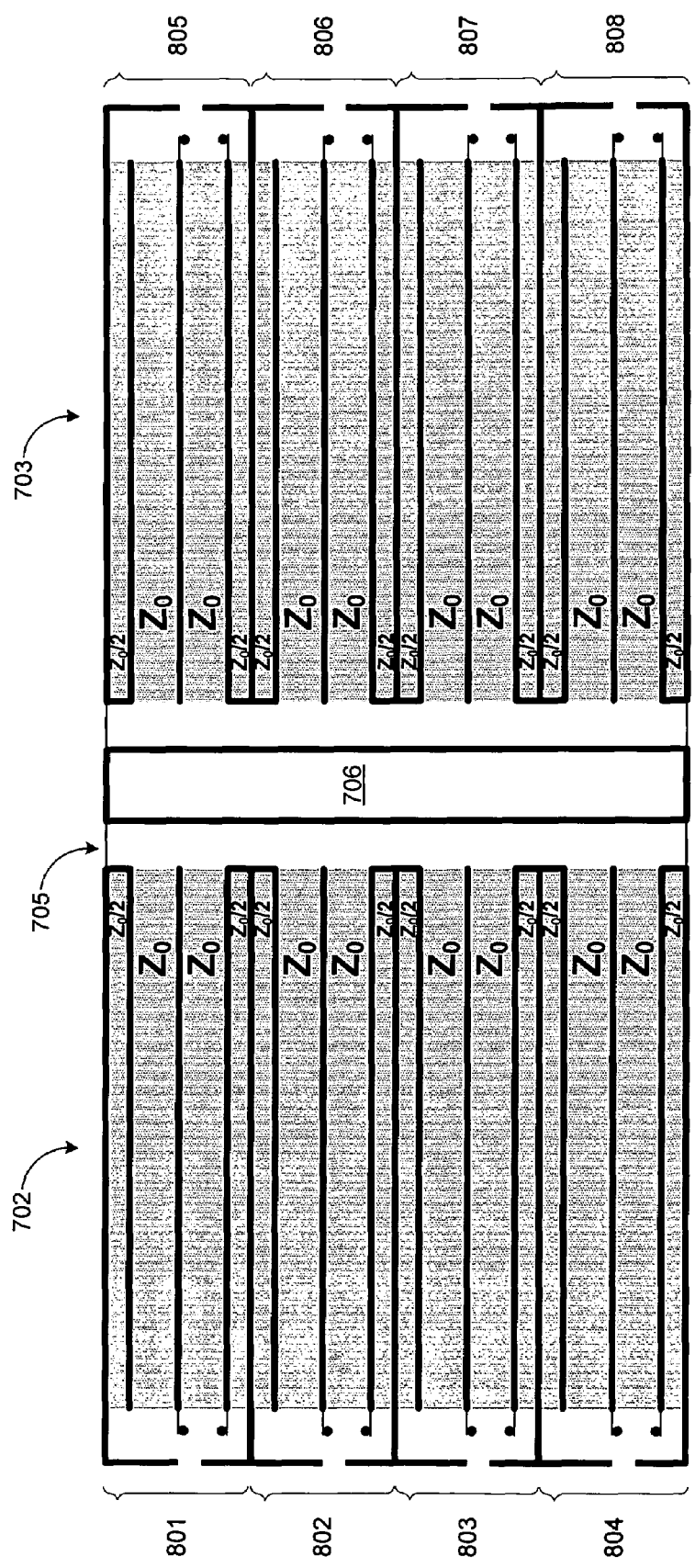
FIG. 8 is a cross-sectional view taken along line A-A of FIG. 7 showing the four stages and the central load.
Figure 9:
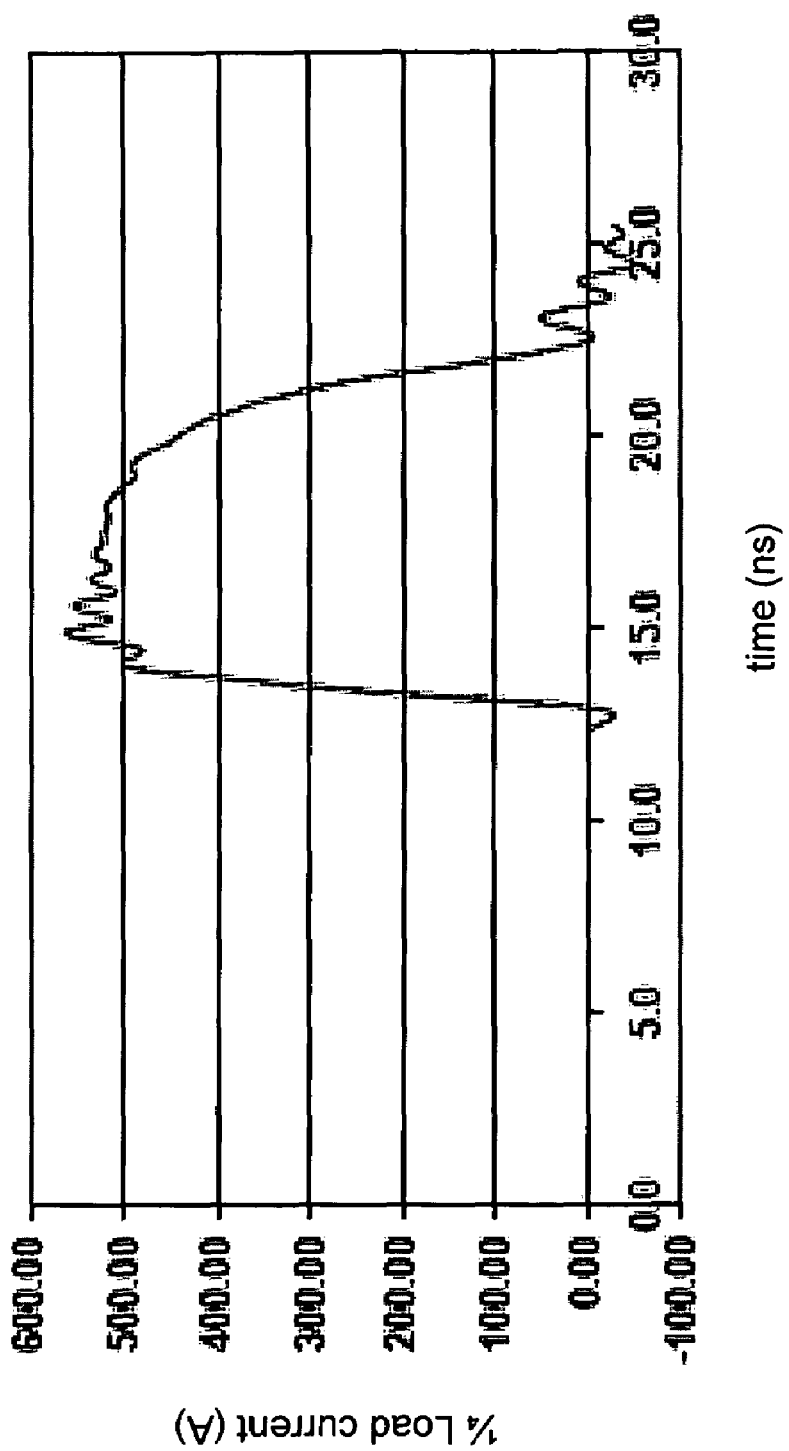
FIG. 9 is a graph illustrating a plot of current in one of four switches (not shown) connecting the resistive load to a corresponding one of the four stacks.

FIGS. 7 and 8 show a fourth exemplary embodiment of a stacked multi-stage accelerator structure using the bipolar pulse forming line modules discussed above. The accelerator structure is shown in FIG. 7 having four identical multi-stage stacks (701-704) in a four quadrant cross pattern. It is appreciated however that other configurations of multi-stack arrangements are possible not limited to four stacks in a four quadrant cross pattern. This arrangement produces a central bore 705 bordered by the first ends of each of the stacks, which helps to improve azimuthal symmetry. In this embodiment, as can be best seen in FIG. 8, each quadrant contains a four-stage stack where each stage is of the type described in the previous section. For example, stack 702 includes modules 801-804, and stack 703 includes modules 805-808. The following example provides an illustration of the operation of the accelerator structure of FIGS. 7 and 8 using exemplary dimensions and parameters. An ideal dielectric material with an εr of 10 is preferably used. Each active layer is 40 cm long, 10 cm wide, 1cm thick, and charged to 10 kV. This yields a layer impedance of 11.92Ω and a one-way transit time of 4.2 ns. Since each stage has two layers, the stage impedance is 23.84Ω. The passive, shorted lines are 0.5 cm thick. With four stages in the stack, the impedance of each quadrant is 95.36Ω. Since the four stacks drive the load in parallel, the impedance of the entire structure is 23.84Ω. In the model, the structure is loaded with a resistive block 4 cm×4 cm×12 cm, shown at 706. The conductivity of the block is set at 3.146 S/m yielding a net resistance of 23.84Ω as required. This block is connected to the stack with a metal plate on the bottom and a set of four switches at the top (not shown). The switches close after three transit times, which corresponds to the transition time between the positive and negative portions of the voltage pulse. Since the total load current is four times the single quadrant current shown in FIG. 9, the total load current is approximately 2000 A. 47 kV is required to drive this current in a 23.84Ω load. This a little more than four times the charge voltage in each stage. Therefore, the voltage from each stage adds (more or less) as expected. As with the one-quadrant, single-stage structure, there is a DC short around the outside of the structure yet the pulse is not shorted out by this path.

Figure 10:
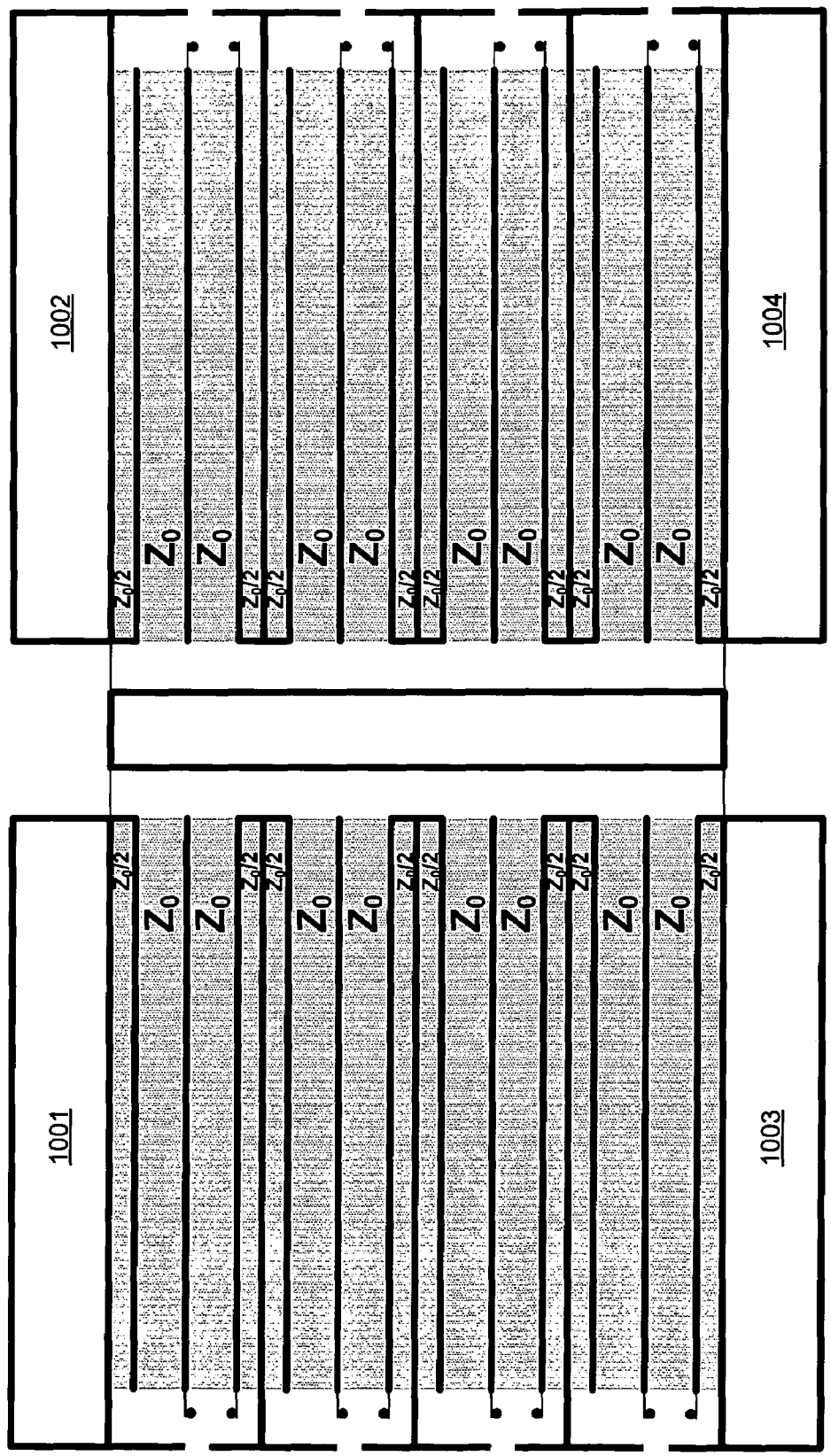
FIG. 10 is a cross-sectional view similar to FIG. 8 also including beam-pipes and end covers.
Figure 11:
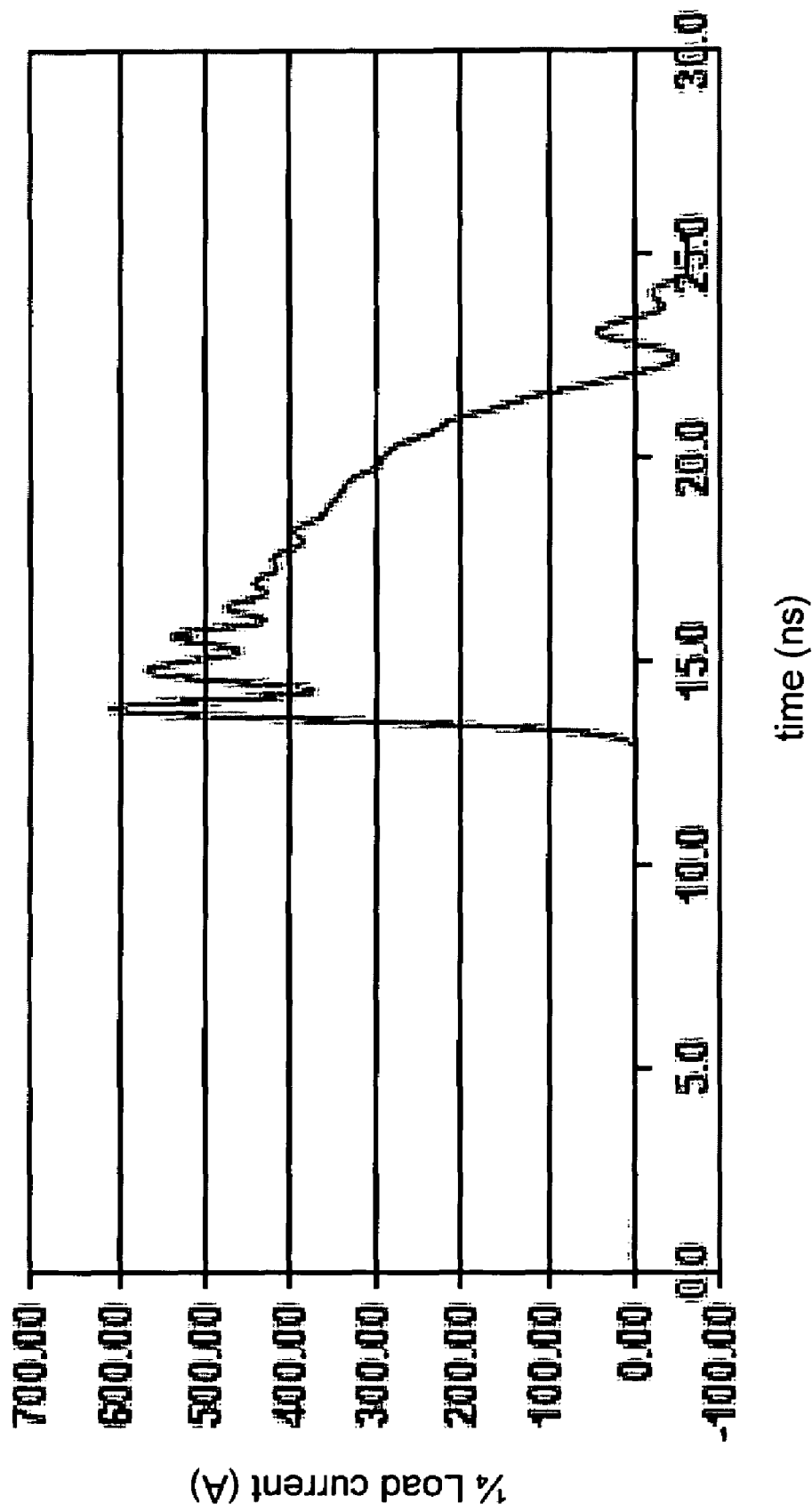
FIG. 11 is a graph illustrating a load current waveform for the structure with beam-pipes and completed end-covers of FIG. 10.

FIG. 10 shows a fifth exemplary embodiment of a stacked multi-stage accelerator structure using the bipolar pulse forming line modules discussed above, and similar in configuration as that discussed for FIGS. 7 and 8. Referring again to FIG. 7, it can be seen that at the ends of the structure there is open space in each corner. While the outer metal boundary does DC-short the structure, it does not entirely cover the structure ends. While it is possible to build an actual accelerator this way as there is a groundable boundary on the exterior of the structure, for completeness another version of the model is shown in FIG. 10 where a metallic beam-pipe has been added at each end and completed the end covers 1001-1004. It can be seen in FIG. 11 that complete end-covers load down the output pulse. This is because the end-covers form a transmission line. The voltage developed by the stack drives this transmission line. The net effect appears like inductive loading.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

I claim:

1. A bipolar pulse forming transmission line module comprising:

first, second, third, fourth, and fifth conductors forming an interleaved stack with each conductor having a first end, and a second end adjacent an acceleration axis, said first and second planar conductors connected to each other at the second ends, said fourth and fifth conductors connected to each other at the second ends, said first and fifth conductors connected to each other at the first ends, said first, second, fourth, and fifth conductors electrically connectable to a ground potential, and said third conductor electrically connectable to a high voltage source;

first, second, third, and fourth dielectric layers provided between the first/second, second/third, third/fourth, and fourth/fifth conductors, respectively, to form an upper passive shorted line, a lower passive shorted line, and two active charged lines between the upper and lower passive shorted lines; and a switch capable of shorting a high voltage from the first end of the third conductor to the first end of the fourth conductor to produce a bipolar pulse with a zero net time integral.

2. The bipolar pulse forming transmission line module of claim 1, wherein the impedances of the two active charged lines are equal to each other, and the impedance of each of the upper and lower passive shorted lines is half the impedance of one of the passive shorted lines.

3. The bipolar pulse forming transmission line module of claim 1, wherein said first and fifth conductors are connected to each other at the first ends by a shorting plate having a aperture adjacent the switch to facilitate access thereto.

4. The bipolar pulse forming transmission line module of claim 1,
wherein said switch is activated by an internally mounted switch activation means.

5. The bipolar pulse forming transmission line module of claim 1,
wherein said conductors are planar conductors.

6. A linear induction accelerator, comprising:
a bipolar pulse forming transmission line module comprising: first, second, third, fourth, and fifth conductors forming an interleaved stack with each conductor having a first end and a second end adjacent an acceleration axis, said first and second conductors connected to each other at the second ends, said fourth and fifth conductors connected to each other at the second ends, said first and fifth conductors connected to each other at the first ends, said first, second, fourth, and fifth conductors electrically connectable to a ground potential, and said third conductor electrically connectable to a high voltage source; first, second, third, and fourth dielectric layers provided between the first/second, second/third, third/fourth, and fourth/fifth conductors, respectively, to form an upper passive shorted line, a lower passive shorted line, and two active charged lines between the upper and lower passive shorted lines; and a switch capable of shorting a high voltage from the first end of the third conductor to the first end of the fourth conductor to produce a bipolar pulse with a zero net time integral; and high voltage power supply means connected to charge said third conductor to a high potential.

7. The linear induction accelerator of claim 6,
further comprising at least one additional bipolar pulse forming transmission line module stacked in alignment with the first bipolar pulse forming transmission line module, with the third conductor of each additional bipolar pulse forming transmission line module connected to said high voltage power supply means to be charged thereby.

8. The linear induction accelerator of claim 7,
wherein, for each of the bipolar pulse forming transmission line modules the impedances of the two active charged lines are equal to each other, and the impedance of each of the upper and lower passive shorted lines is half the impedance of one of the passive shorted lines.

9. The linear induction accelerator of claim 7,
wherein, for each of the bipolar pulse forming transmission line modules said first and fifth conductors are connected to each other at the first ends by a shorting plate having an aperture adjacent the switch to facilitate access thereto.

10. The linear induction accelerator of claim 7,
wherein, for each of the bipolar pulse forming transmission line modules said switch is activated by an internally mounted switch activation means.

11. The linear induction accelerator of claim 7,
wherein said conductors are planar conductors.

* * * * *